(12) United States Patent
Brazzelli et al.

(10) Patent No.: US 7,820,504 B2
(45) Date of Patent: Oct. 26, 2010

(54) METHOD FOR MANUFACTURING DIFFERENTIAL ISOLATION STRUCTURES IN A SEMICONDUCTOR ELECTRONIC DEVICE AND CORRESPONDING STRUCTURE

(76) Inventors: Daniela Brazzelli, Via Zappellini, 17, I-21052 Busto Arsizio (VA) (IT); Livio Baldi, Via Dante, 26, I-20041 Agrate Brianza (MI) (IT); Giorgio Servalli, Via Cabina, 14/P, I-24040 Ciserano (BG) (IT)

( * ) Notice: Subject to any disclaimer, the term of this patent is extended or adjusted under 35 U.S.C. 154(b) by 0 days.

(21) Appl. No.: 10/890,529

(22) Filed: Jul. 12, 2004

(65) Prior Publication Data

US 2005/0042812 A1    Feb. 24, 2005

(30) Foreign Application Priority Data

Jul. 11, 2003   (EP) ................................. 03425459

(51) Int. Cl.
*H01L 21/8238*   (2006.01)
*H01L 27/108*   (2006.01)

(52) U.S. Cl. .................... 438/225; 438/258; 438/259; 438/287; 438/735; 438/769; 257/296; 257/410; 257/411; 257/E21.625; 257/E21.639; 257/E27.081

(58) Field of Classification Search .................. 438/225, 438/258, 259, 287, 735, 769; 257/296, 410, 257/411, E21.625, E21.639, E27.081
See application file for complete search history.

(56) References Cited

U.S. PATENT DOCUMENTS

| | | | | |
|---|---|---|---|---|
| 5,607,868 A | * | 3/1997 | Chida et al. | 438/258 |
| 5,889,335 A | * | 3/1999 | Kuroi et al. | 257/797 |
| 6,181,018 B1 | | 1/2001 | Saino | 257/797 |
| 6,380,020 B1 | * | 4/2002 | Shimizu | 438/225 |
| 6,391,720 B1 | * | 5/2002 | Sneelal et al. | 438/259 |
| 6,653,675 B2 | * | 11/2003 | Gonzalez et al. | 257/296 |
| 6,773,999 B2 | * | 8/2004 | Yoneda | 438/287 |
| 7,042,064 B2 | * | 5/2006 | Beasom | 257/528 |
| 2002/0093071 A1 | | 7/2002 | Chheda et al. | 257/510 |

OTHER PUBLICATIONS

European Search Report, EP03425459, Mar. 26, 2004.

* cited by examiner

*Primary Examiner*—Dao H Nguyen
(74) *Attorney, Agent, or Firm*—Trop, Pruner & Hu, P.C.

(57) ABSTRACT

Embodiments of this invention relate to a method for manufacturing isolation structures with different depths in a monolithically integrated semiconductor electronic device. An inventive method according to an embodiment of the invention comprises a first step of defining active areas on a semiconductor material substrate, a second step of forming isolation structures by realising trenches in said substrate and then filling them with field oxide, a third step of defining lithographically at least a first device area, and a fourth step of realising a digging in the substrate and in the field oxide of said first device area.

12 Claims, 15 Drawing Sheets

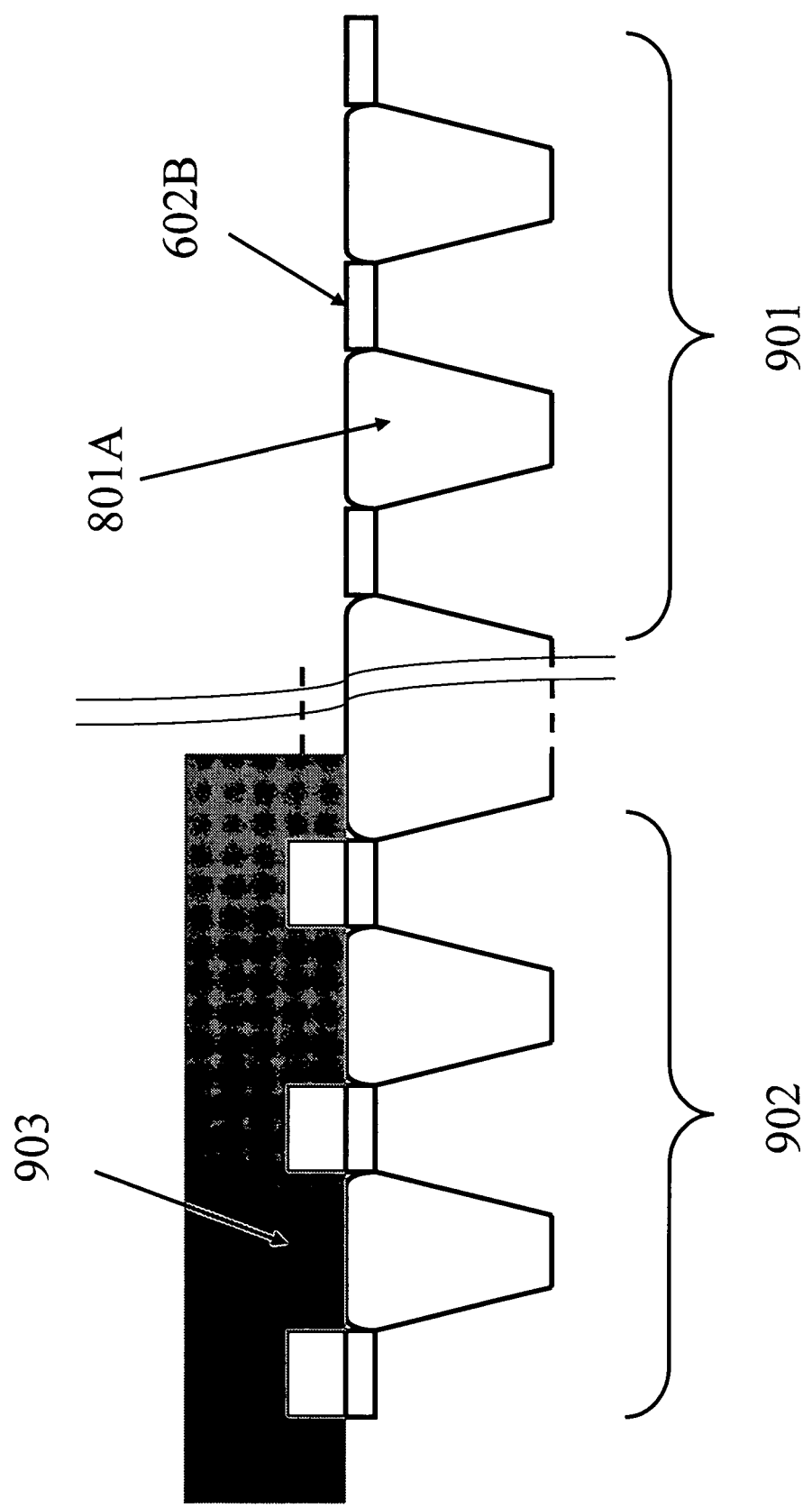

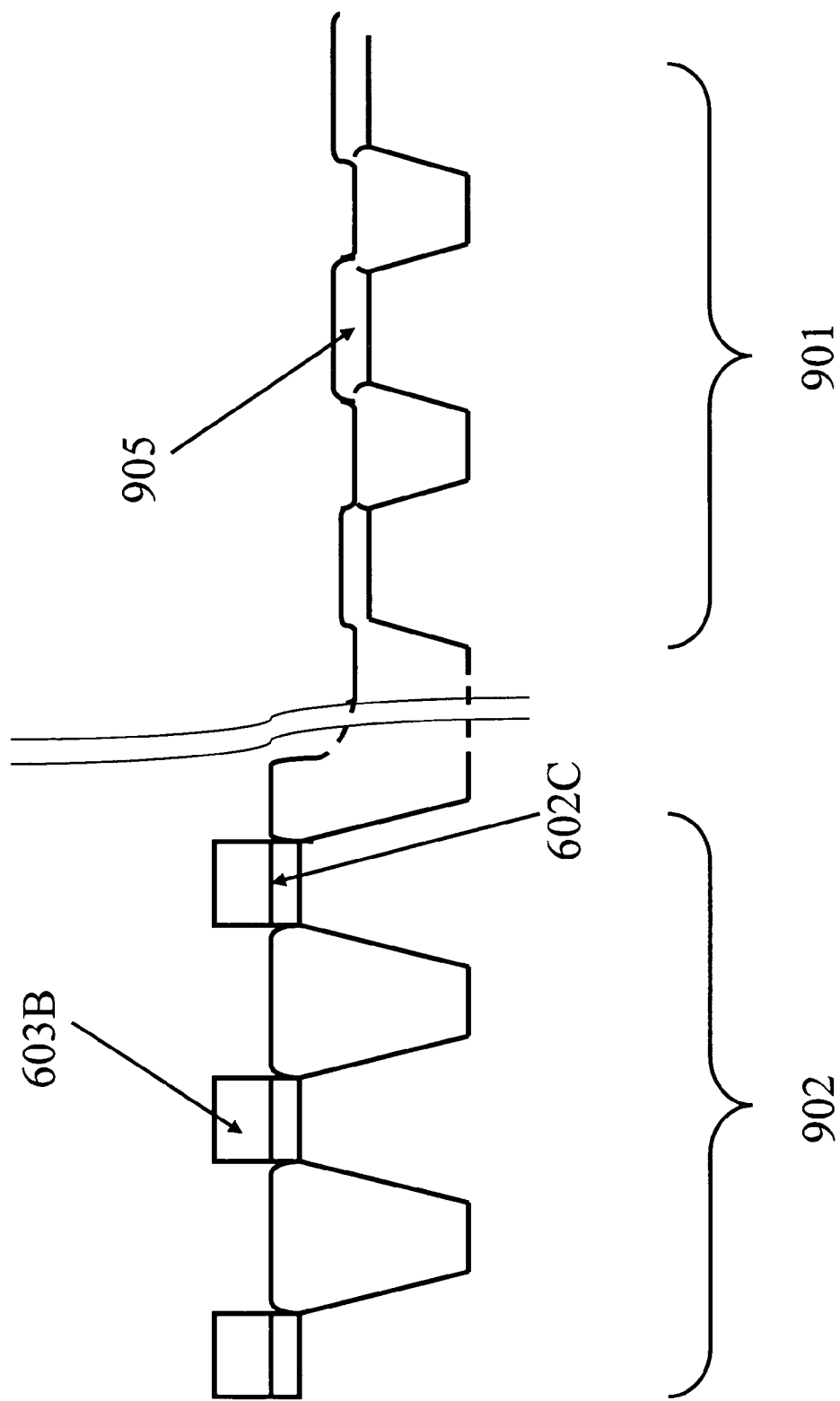

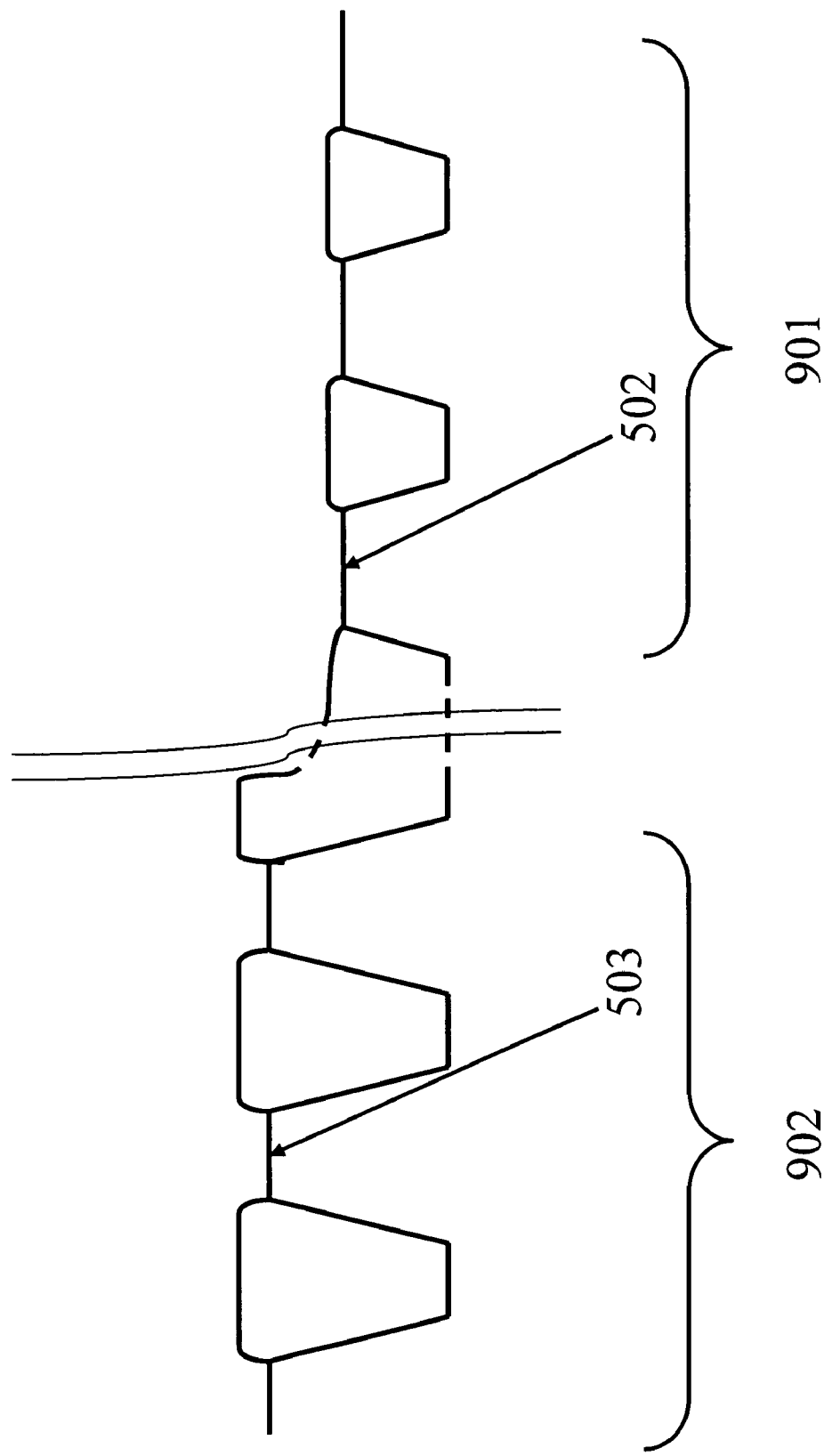

METHOD FOR MANUFACTURING DIFFERENTIAL ISOLATION STRUCTURES IN A SEMICONDUCTOR ELECTRONIC DEVICE AND CORRESPONDING STRUCTURE

PRIORITY CLAIM

This application claims priority from European patent application No. 03425459.9, filed Jul. 11, 2003, which is incorporated herein by reference.

TECHNICAL FIELD

Embodiments of the present invention relate to methods for manufacturing isolation structures in an electronic device.

More particularly, embodiments of the invention relate to a method for manufacturing isolation structures of different thickness in a monolithically integrated semiconductor electronic device.

Although not limited to the described embodiments, these embodiments of the invention particularly relate to isolation structures of different thicknesses in a monolithically integrated semiconductor electronic device, and containing a matrix of non-volatile memory cells and associated circuitry, reference being made in the following description to this field of application for convenience of explanation only.

BACKGROUND

As it is known, a monolithically integrated semiconductor electronic device consists of electrically active areas, commonly known as the active areas, and of electrically passive areas, commonly known as isolation areas. Active areas can be classified according to the type of electric structure that they contain. For example, there can be storage areas typically containing memory cells, and circuit areas typically containing transistors, capacitors and resistors.

A block diagram, not to scale, of a monolithically integrated semiconductor electronic device 10 and of advanced generation is shown in FIG. 1 by way of example. This device, which contains memory, circuit, and isolation areas not shown in FIG. 1, typically has at least one circuit area 102 and at least one so-called matrix area 101, the latter comprising a plurality of memory cells being matrix-like arranged. This means that the memory cells are arranged in rows, or wordlines, and columns, or bit-lines.

Associated with this memory cell matrix is a plurality of transistors of the circuit area 102, which forms the control circuitry of the device.

The isolation areas provided in the device 10 have the aim of isolating, electrically and physically, each active area from the others, and of reducing possible parasitic effects. These isolation areas are usually formed simultaneously in different areas of the device 10, and appear in both the matrix and the circuit areas, 101 and 102.

Now, the technology progress presses a demand for reduced size of monolithically integrated semiconductor electronic devices, and this requirement makes it necessary to develop innovative technological solutions, allowing to manufacture of reduced-size devices with satisfactory structural and functional characteristics.

In particular, the isolation areas should have suitable sizes for memory cells in the matrix area 101 to be manufactured with a high density layout. Both the high density memory cells of the matrix area 101 and the transistors of the circuit area 102 must have, on the other side, an optimal behaviour.

At present in more advanced technologies, the reduction of isolation structure sizes, necessary to provide the matrix area 101 with high-density memory cells, comes out in a lower reduction of the parasitic effects in the circuit area 102, and in the consequent degradation of the transistor electrical performances. These problems impose manufacture of isolation structures of different thickness according to the device area being considered, a thickness which is to be smaller in the matrix area 101 than in the circuit area 102. These isolation structures of different thickness are defined as differential isolation. Schematic cross-sections, not drawn to scale, of differential isolation structures 20 of the STI (Shallow Trench Isolation) type are shown in FIG. 2, this figure indicating isolation structures 201 of the matrix area 101 alternated with matrix active areas 202, and isolation structures 203 of the circuit area 102 alternated with active circuit areas 204.

A prior art solution to obtain differential isolation structures 20 consists in manufacturing isolation structures, separately and by means of dedicated masks, these structures having different thickness and depths. In detail, this solution is exemplified by STI structures, and comprises the following steps:

A) providing, on a semiconductor material substrate, a succession of dielectric layers, typically made of a silicon oxide or pad oxide layer and a nitride layer;

B) defining, as by lithography and an appropriate resist mask, the active areas 204 of the circuit area 102;

C) anisotropically etching the nitride and pad oxide layers in the circuit area 102;

D) etching silicon, suitable to form STI isolation structures in the circuit area 102;

The steps of forming a succession of dielectric layers (A), of lithographic defining (B), of nitride and pad oxide etching (C) and of silicon etching (D), on a substrate, jointly traces a standard flow process, known as single-isolation process, wherein the isolation structures are formed simultaneously in the matrix area and in the circuit area of the device.

E) removing the resist used in the above lithographic definition;

F) repeating the lithographic defining (B), nitride and pad oxide etching (C), silicon etching (D), and resist removing (E) steps for the matrix area 101. In this case, the silicon etching step (D) must be appropriate to form STI isolation structures which are thinner than the STI isolation structures formed in the circuit area 102. Differential isolation structures 20 are thus provided.

Although advantageous on several counts, this solution has the drawback of requiring the repetition of some process steps with respect to what happens in the standard single-isolation flow process. In particular, the lithographic defining (B), nitride and pad oxide etching (C), silicon etching (D), and resist removing (E) steps in the above exemplary flow process are to be carried out a first time for the circuit area 102 and a second time for the matrix area 101. In addition, in this solution, the mask employed during the lithographic defining step (B) is used a second time. A direct negative consequence of this solution stays in the increased cost and time requirements for manufacturing the isolation structures.

Problems are also brought about by the presence of memory cells inside monolithically integrated semiconductor electronic devices 10 and of advanced generation. For instance, where the memory cells are floating gate non-volatile cells, unevenness of size and thickness often appears in the layers that form the memory cells and transistors, this unevenness affecting the device performance.

An exemplary floating gate non-volatile memory cell, to be typically comprised in the matrix area 101 of the device 10, is schematically shown, in cross section and not to scale, limited to its layers of concern in FIG. 3, where the whole memory cell is indicated with reference number 30. This cell 30 comprises a source region 301, a drain region 302, and a succession of layers forming a gate region globally indicated with reference number 303. The gate region 303 comprises a first or floating gate layer 305 formed above the substrate of semiconductor material and separated from the latter by a thin dielectric layer 304, called tunnel oxide. A second or control gate layer 307 is capacitively coupled to the first floating gate layer 305 by a dielectric layer 306, called interpoly dielectric.

An exemplary transistor 40 of the circuit area 102 is schematically shown, in cross section and not to scale, limited to its layers of concern in FIG. 4.

This transistor typically includes a gate region 303, comprising a gate layer 404 formed above the semiconductor material substrate and separated from the latter by a thin dielectric layer 401, called gate oxide. A source region 402 and a drain region 403 are integrated in the substrate of semiconductor material at the sides of the gate region 303.

As it is well known, the control gate layer 307 and the gate layer 404 are usually formed through a first step (G) of depositing the same polysilicon layer, a second step (I) of lithography defining, and a third step (J) of etching the polysilicon layer.

A problem affecting all monolithically integrated semiconductor electronic devices 10 and of advanced generation, having memory cells 30 in the matrix area 101 and transistors 40 in the circuit area 102, arises in the defining of the polysilicon layer that constitutes the control gate layer 307 and gate layer 404, especially at the boundary of the matrix area 101. In fact the thickness of the layer succession under the polysilicon layer is different in the matrix 101 and circuit 102 area, typically higher in the matrix area 101 because of the presence of the floating gate layer 305 and the interpoly dielectric 306. Thus, the polysilicon layer is bound to be non-planar at the boundary of the matrix area 101. This unevenness causes possible lithographic defining problems resulting in the size and performance of those memory cells 30 which are located at the boundary of the matrix area 101.

A first known solution solves this problem by performing a CMP (Chemical-Mechanical Polishing) step (H) after the polysilicon layer depositing step (G) to reduce the thickness of the polysilicon layer in the matrix area 101. The lithographic defining step (I) of the polysilicon layer and the etching step (J) are then carried out.

However, the above solution can have a drawback, due to the fact that the CMP technique applied during the etching step (H) needs, to be correctly and successfully performed, the layer to be etched to have an almost planar morphology. Accordingly to this solution, the different height of the polysilicon layer in the matrix areas 101 and in the circuit area 102 requires to maintain the polysilicon layer depositing step (G) until an almost planar morphology of the layer itself is achieved. In this way, however, a portion of the polysilicon layer of particularly high thickness is obtained in the circuit area 102, which brings about subsequent doping problems of that polysilicon portion.

A second solution (Patent Application EP 02425311.4) implies the polysilicon depositing step (G) to be followed by a masking step (L) exposing a portion of the polysilicon layer in the matrix area 101. An etching step (M), called etch-back, of the portion of the polysilicon layer in the matrix area 101 and a step (N) of removing the resist used in the above masking step (L) are then carried out. This is followed by the lithographic polysilicon layer defining step (I) and by the etching step (J).

Although achieving its object, also this solution shows integration problems because the etch-back step (M) is hard to control and can easily lead to an excessive reduction of the polysilicon layer thickness of the matrix area 101, with subsequent quality problems of the dielectric layers and possible device malfunctioning.

The technical problem that underlies this invention is to provide a method for manufacturing a monolithically integrated semiconductor electronic device and of advanced generation, with such characteristics as to allow differential isolation structures to be formed and the gate regions accurately defined especially at the boundary of a memory cell matrix, thereby overcoming the limitations and/or drawbacks of prior art methods.

SUMMARY

An aspect of this invention is realising a digging in one or more areas of a monolithically integrated semiconductor electronic device. This digging is realised after a formation step of isolation structures in the device, and before forming and defining steps of electrically active layers above a starting substrate.

On the basis of this aspect, the current prior art technical problem is solved by a method as herein described.

Moreover, on the basis of this aspect the current prior art technical problem is further solved by a structure as herein described.

Features and advantages of the inventive methods and structures should become apparent from the following description of an embodiment thereof, given by way of non-limiting example with reference to the accompanying drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
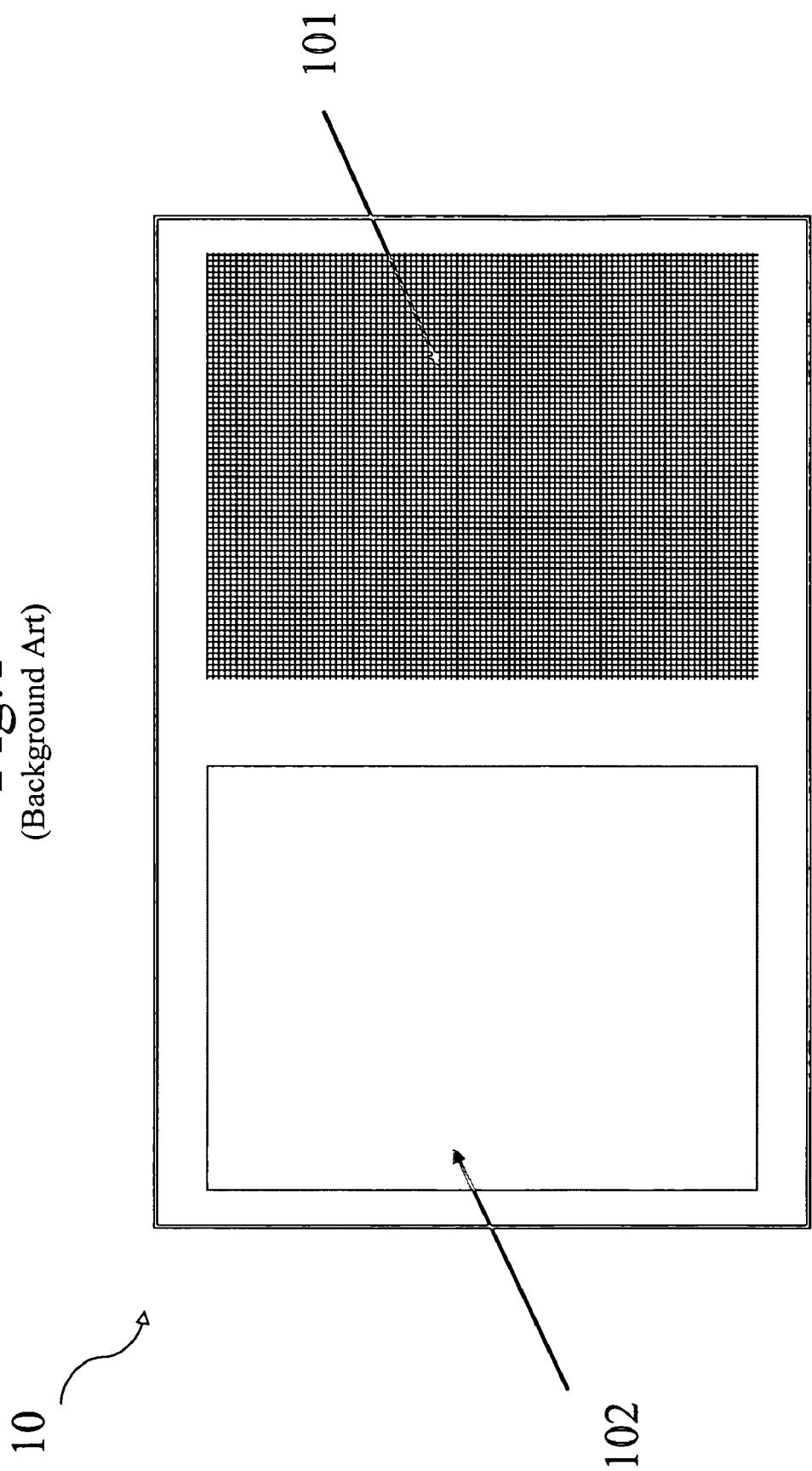
FIG. 1 is a block diagram, not drawn to scale, limited to concerned regions of a monolithically integrated semiconductor electronic device according to the prior art.
Figure 2:
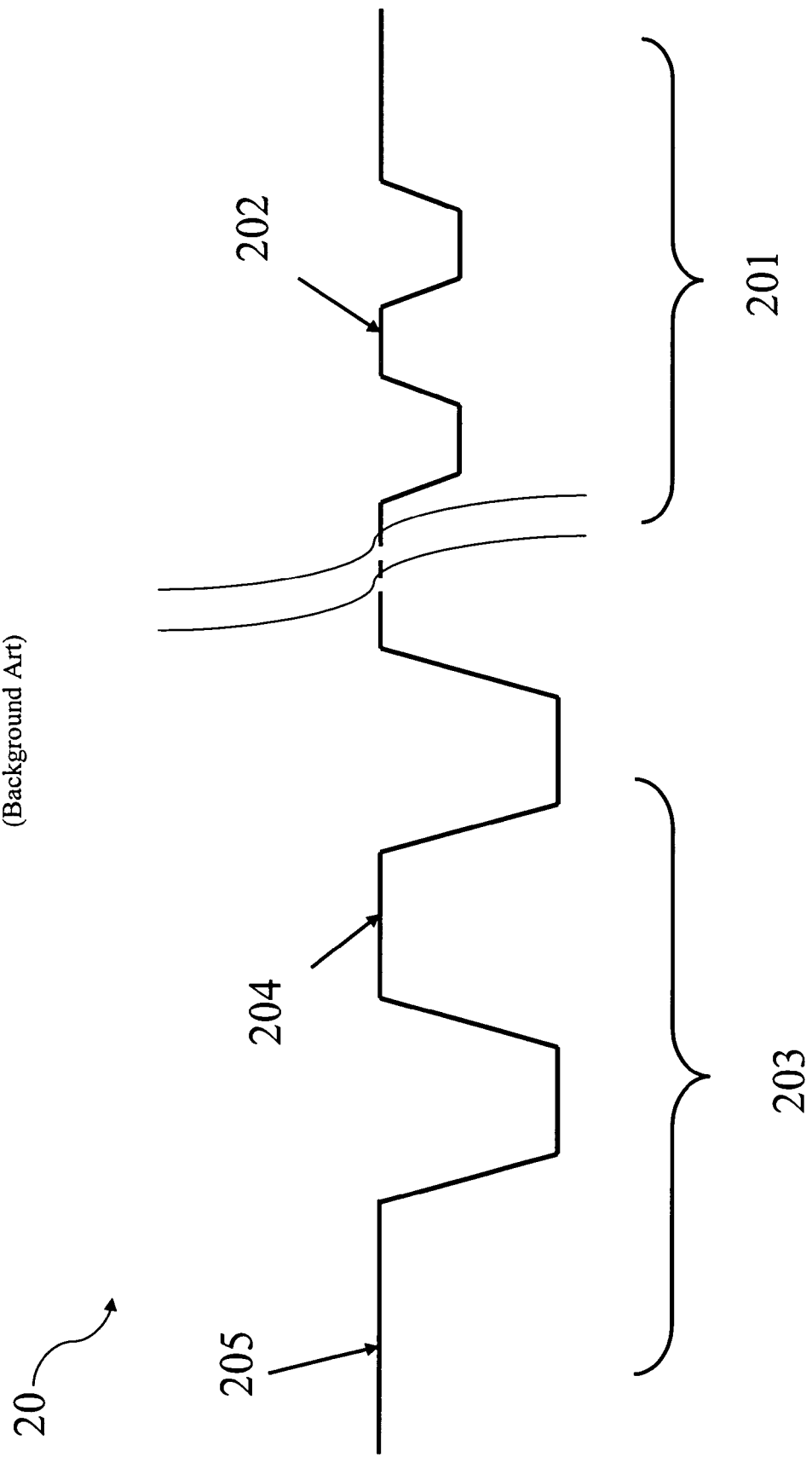
FIG. 2 is a schematic cross-section, not drawn to scale, of STI differential isolation structures according to the prior art.
Figure 3:
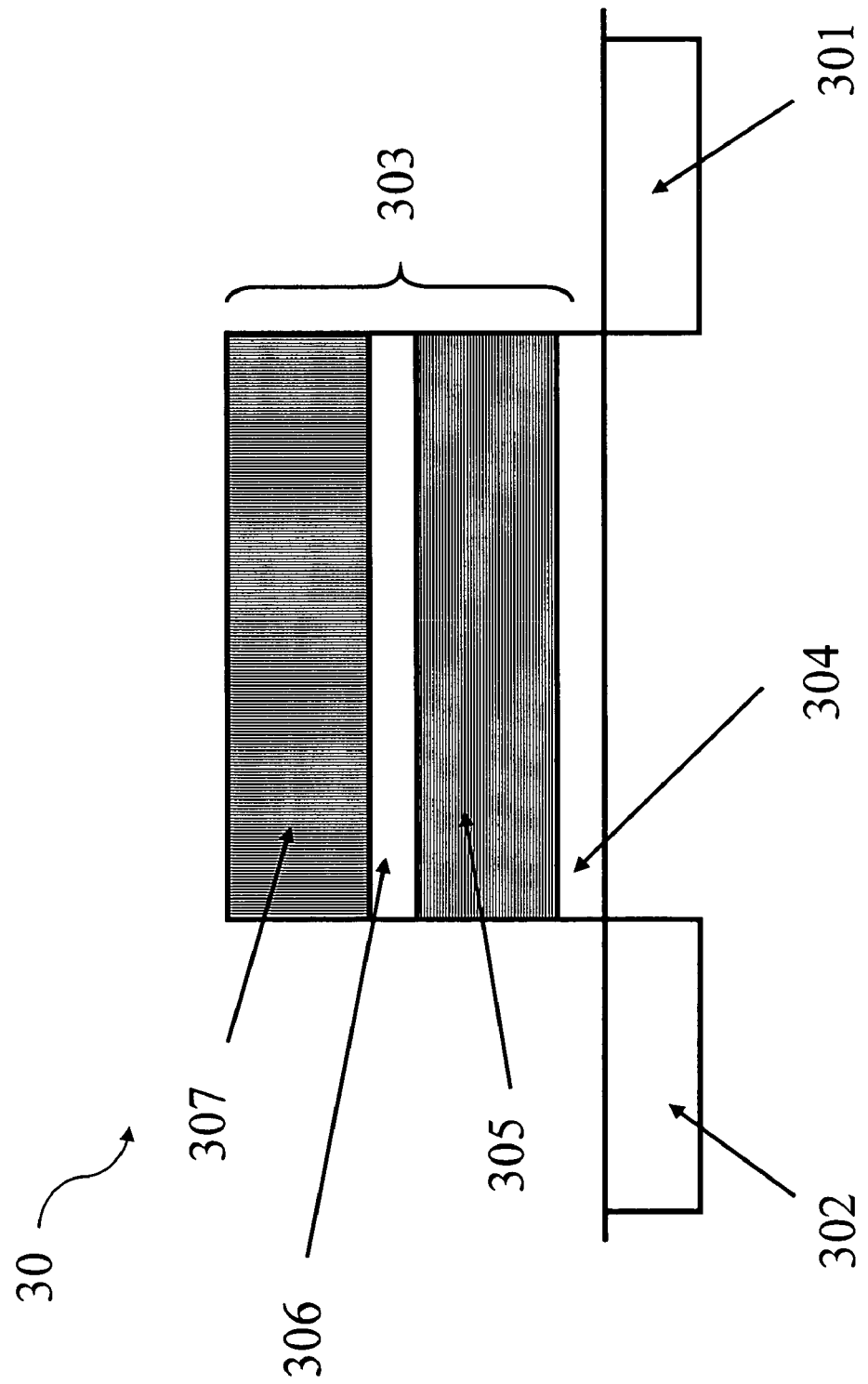
FIG. 3 schematically shows a cross section, not to scale, of an example of floating gate non-volatile memory cell according to the prior art, limited to concerned layers thereof.
Figure 4:
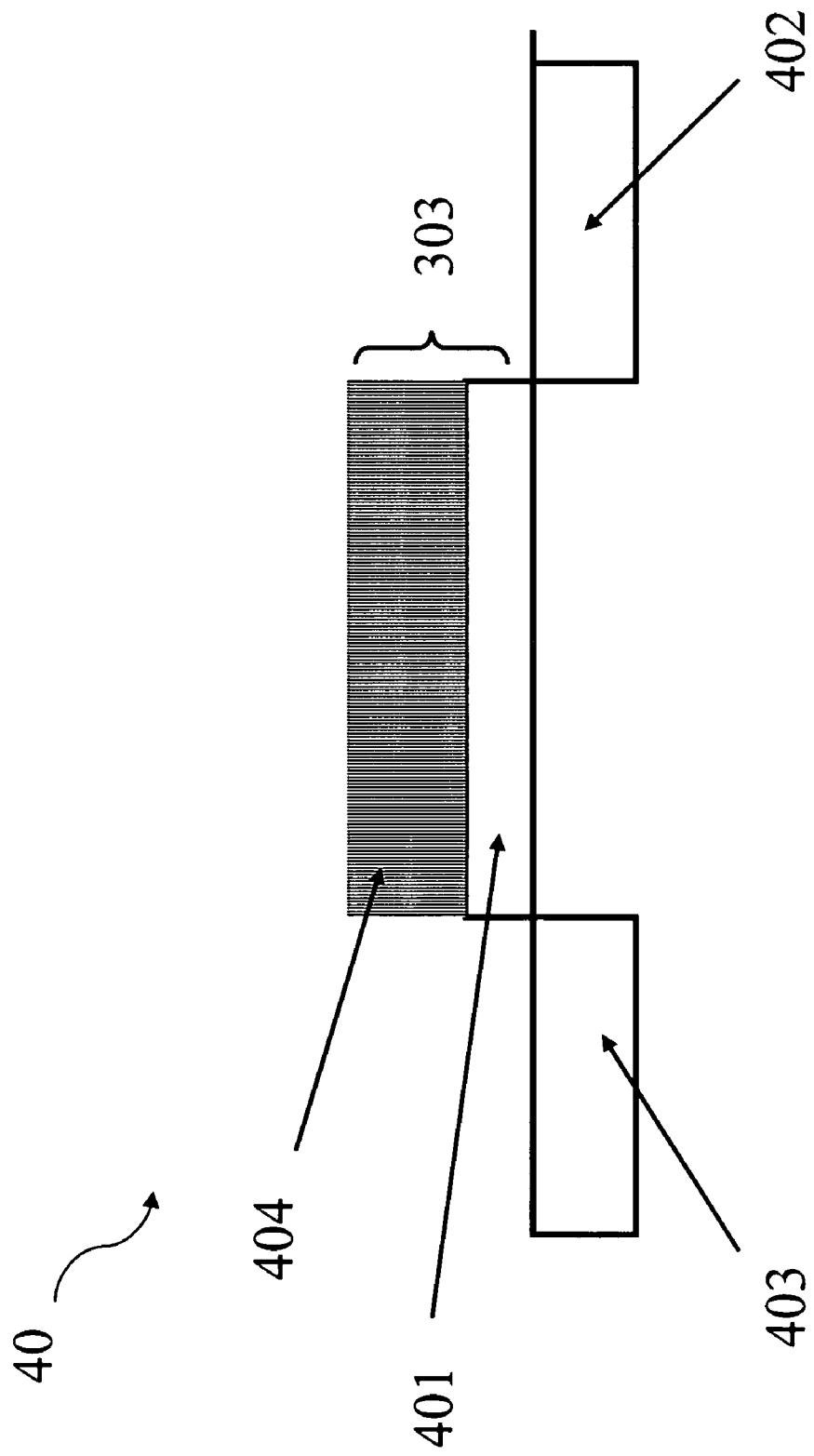
FIG. 4 is a schematic cross-section, not drawn to scale, limited to concerned layers of an example of transistor, typically included within a prior art circuit area.
Figure 5:
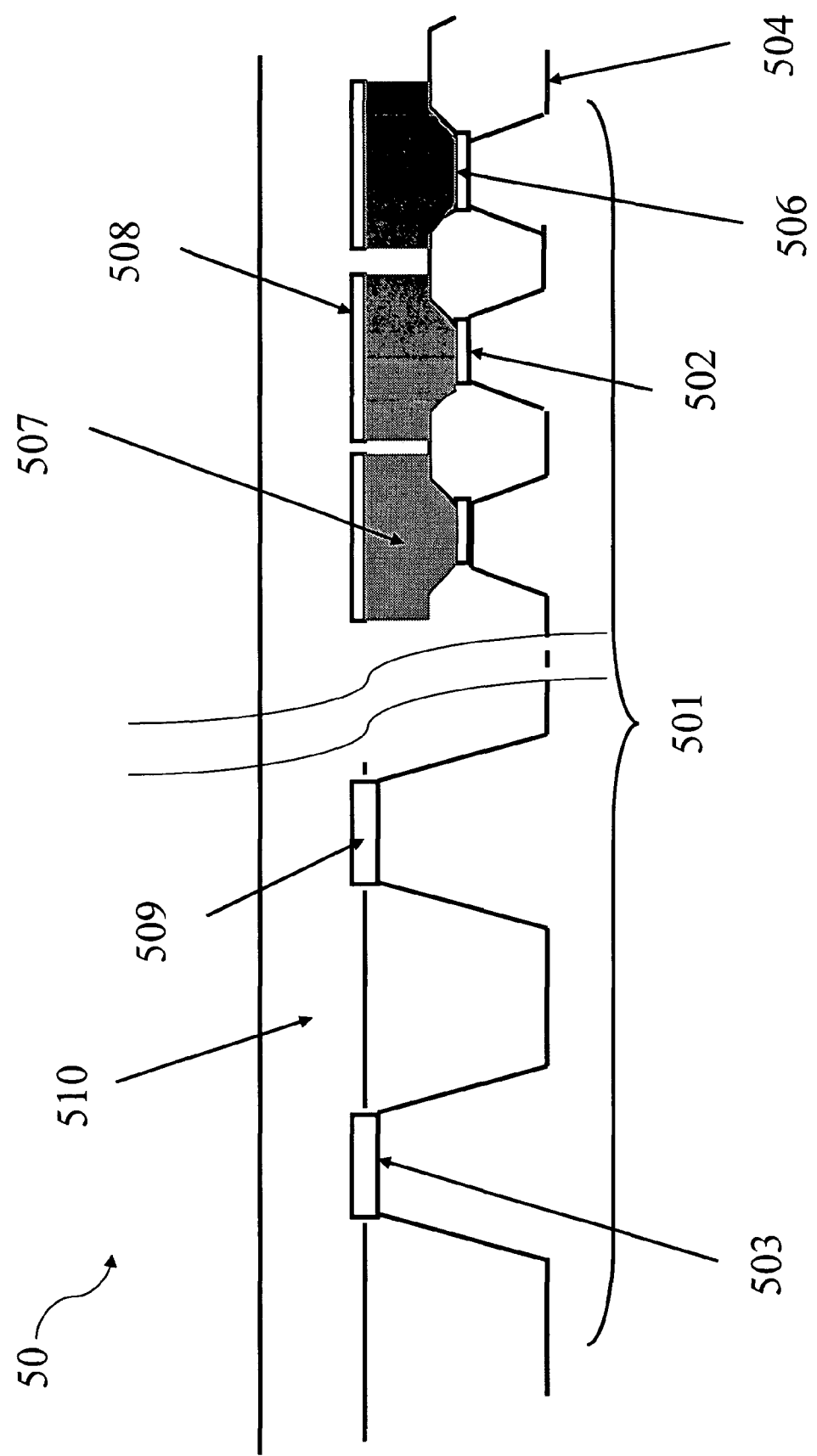
FIG. 5 is a schematic cross-section, not drawn to scale, limited to concerned layers of a preferred structure according to an embodiment of the invention.

According to an embodiment of the invention, a monolithically integrated semiconductor electronic device comprises at least a matrix area and at least a circuit area, and it comprises a structure 50 as shown schematically in cross-section, not to scale, in FIG. 5 limited to concerned layers. The structure 50 exemplifies a device containing floating gate non-volatile flash memory cells. The structure 50 includes differential isolation structures 501 of the STI (Shallow Trench Isolation) type, active areas 502 of floating gate non-volatile flash memory cells, and active areas 503 of transistors. Provided in the active areas 502 are a first tunnel oxide layer 506, a second floating gate layer 507, and a third interpoly dielectric layer 508. Provided in the active areas 503 is a first dielectric layer 509 known as the gate oxide. The differential isolation structures 501 are characterised by a bottom wall 504 extending at the same depth with respect to the surface 205 of the starting substrate in each area of the device. The active areas 502 and 503 are provided at a different depth with respect to the starting substrate surface 205. Accordingly, the morphology of a polysilicon layer 510 provided above the aforementioned layers is substantially planar. These features concur to obtain important advantages as for uniform size of the gate regions in both the matrix and the circuit area, enhancing the device performance and allowing at the same time the STI isolation structures to have different thickness in the matrix and circuit areas.

A method for forming the structure 50 in accordance with an embodiment of the invention advantageously comprises the process steps described here below. The description includes only those commonly used process steps that are necessary to an understanding of this invention.

The figures showing cross-sectional views of portions of an integrated circuit at different steps of its fabrication are not drawn to scale, but they are intended to illustrate major features of this embodiment of the invention.

Figure 6:
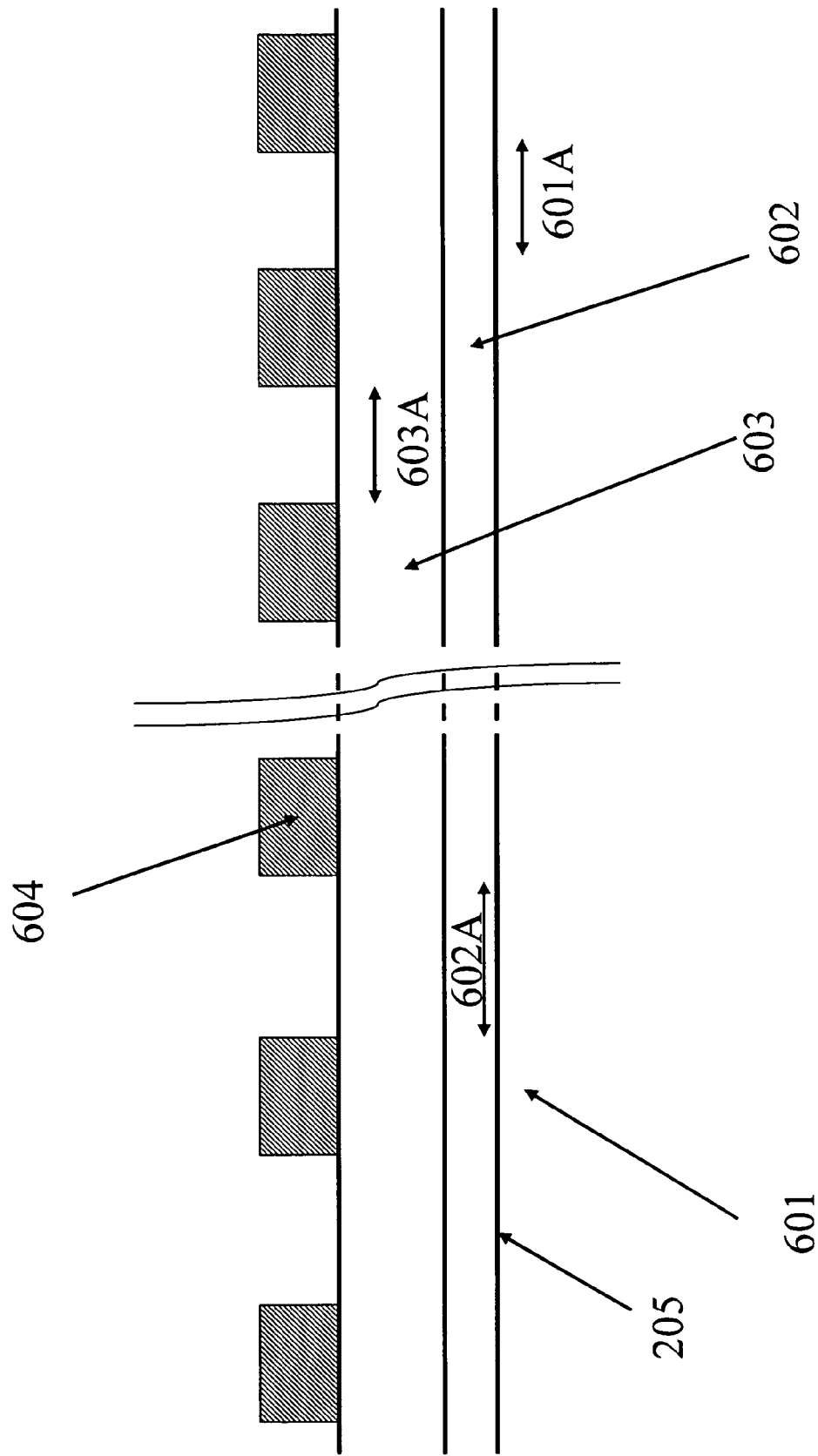
FIGS. 6 to 9G are schematic cross-sections, not drawn to scale, limited to concerned layers at different steps of an inventive method according to an embodiment of the invention.

An inventive method of forming differential isolation structures will now be described in detail with reference to FIGS. 6 to 9 and in relation, for example, to a monolithically integrated semiconductor electronic device which contains floating gate non-volatile flash memory cells and wherein the isolation structures are STI structures. The method according to this embodiment of the invention comprises the steps listed here below, to be carried out in sequential order:

the exposed surface 205 of a semiconductor material substrate 601, shown in FIG. 6, is provided with a succession of layers of a dielectric material, made of a silicon or pad oxide layer 602 and nitride layer 603, for example;

circuit and matrix active areas are lithographically defined by means of a mask using for example a resist 604.

Figure 7:
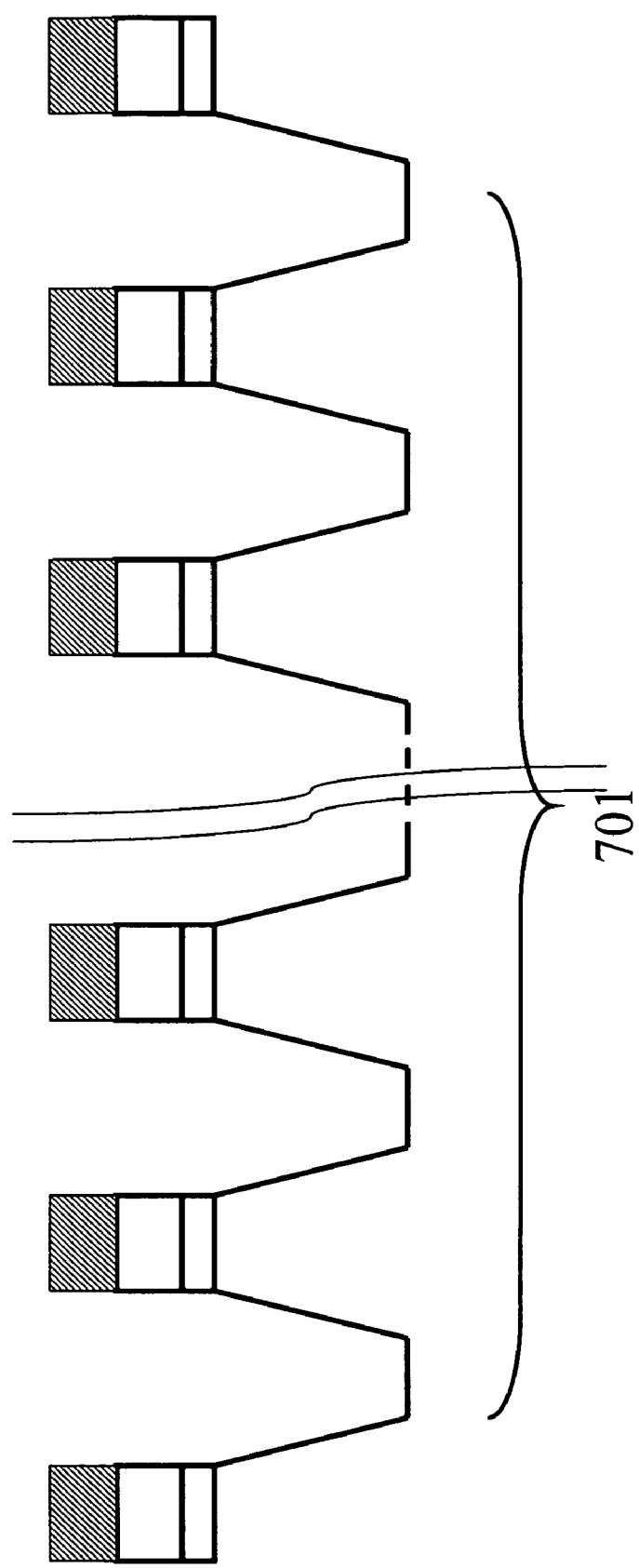

Portions 603A of the nitride layer 603 left uncovered by the resist 604 are anisotropically etched;

portions 602A of pad oxide 602 and portions 601A of substrate 601 left uncovered by the resist 604 are etched. As shown in FIG. 7, this etching step forms trenches 701 in the areas of the device left uncovered by the resist 604;

the resist 604 used in the above lithographic defining step is removed.

The trenches 701 are filled with one or more dielectric material layers, obtained through oxidation or deposition. The aggregate of these dielectric material layers is commonly referred to as the field oxide and it is indicated with reference number 801 in FIG. 8;

preferably, the field oxide 801 is subjected to a thickening treatment to improve unevenness as for speed in etching the several layers forming it;

a planarising step is carried out, e.g. through CMP (Chemical-Mechanical Polishing) technique. This planarising step, not illustrated, is effective to reduce the height of the field oxide 801 with respect to the surface of the substrate 601, levelling it down to that of a portion 603B of the nitride layer 603 still present.

Figure 8:
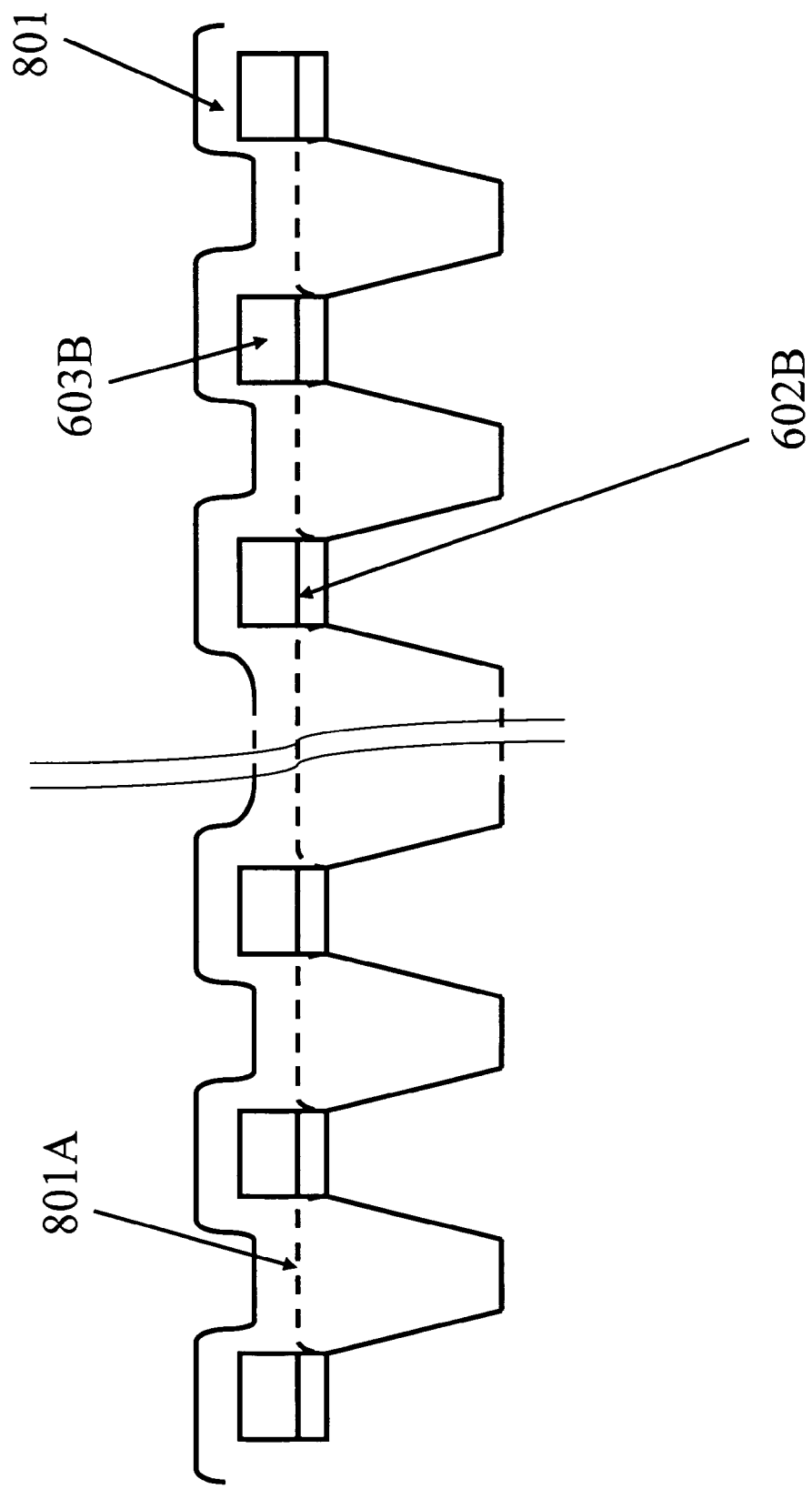

The above planarising step may be followed by a wet etching step, directed to further reduce the height of the field oxide 801 with respect to the surface of the substrate 601. A field oxide 801A, dot-lined in FIG. 8, is thus obtained in some areas of the device, the field oxide having a lower height than that of portion 603B of the nitride layer 603 still present, always with respect to the surface of substrate 601.

Figure 9A:
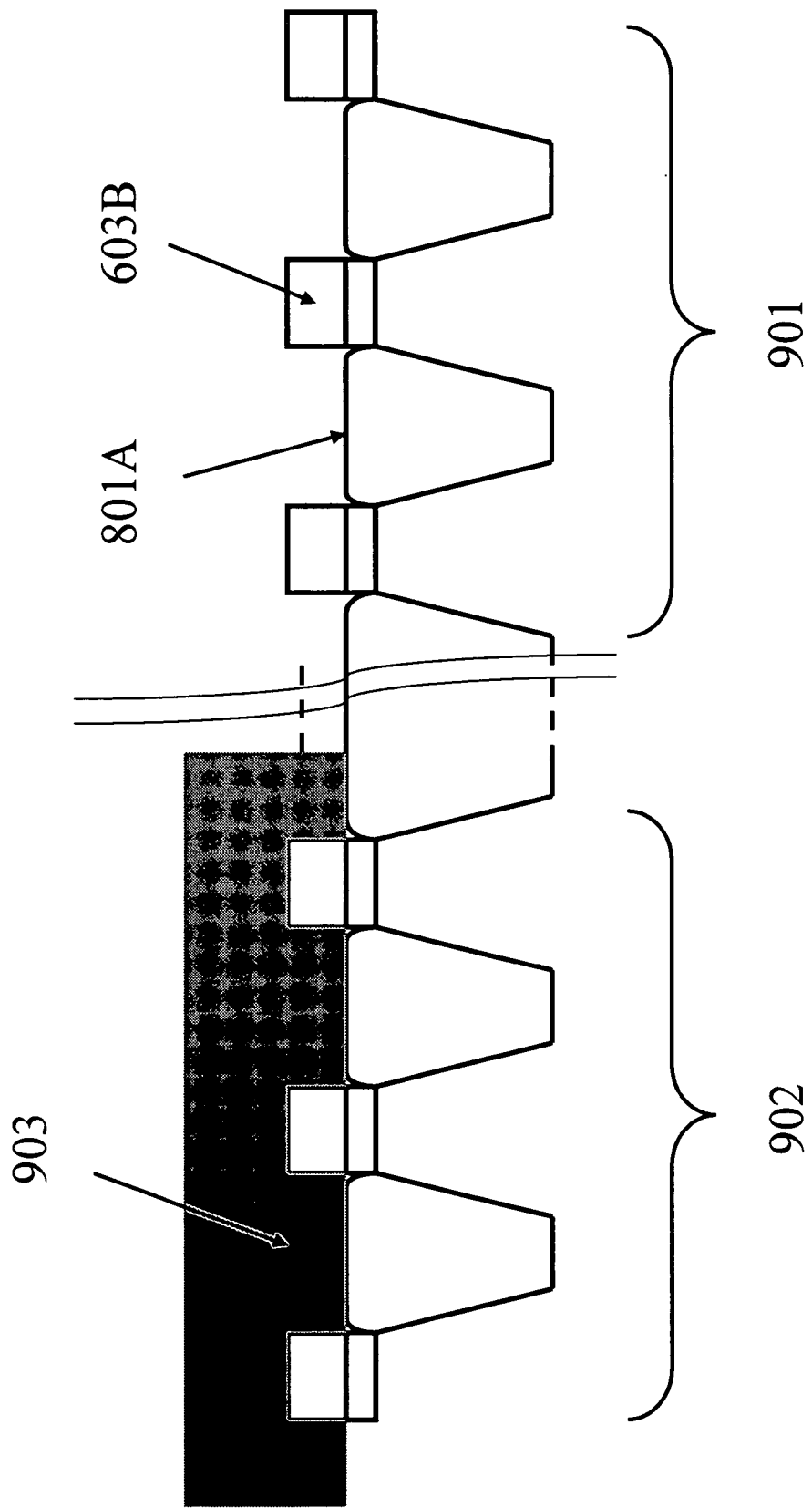
Figure 9C:
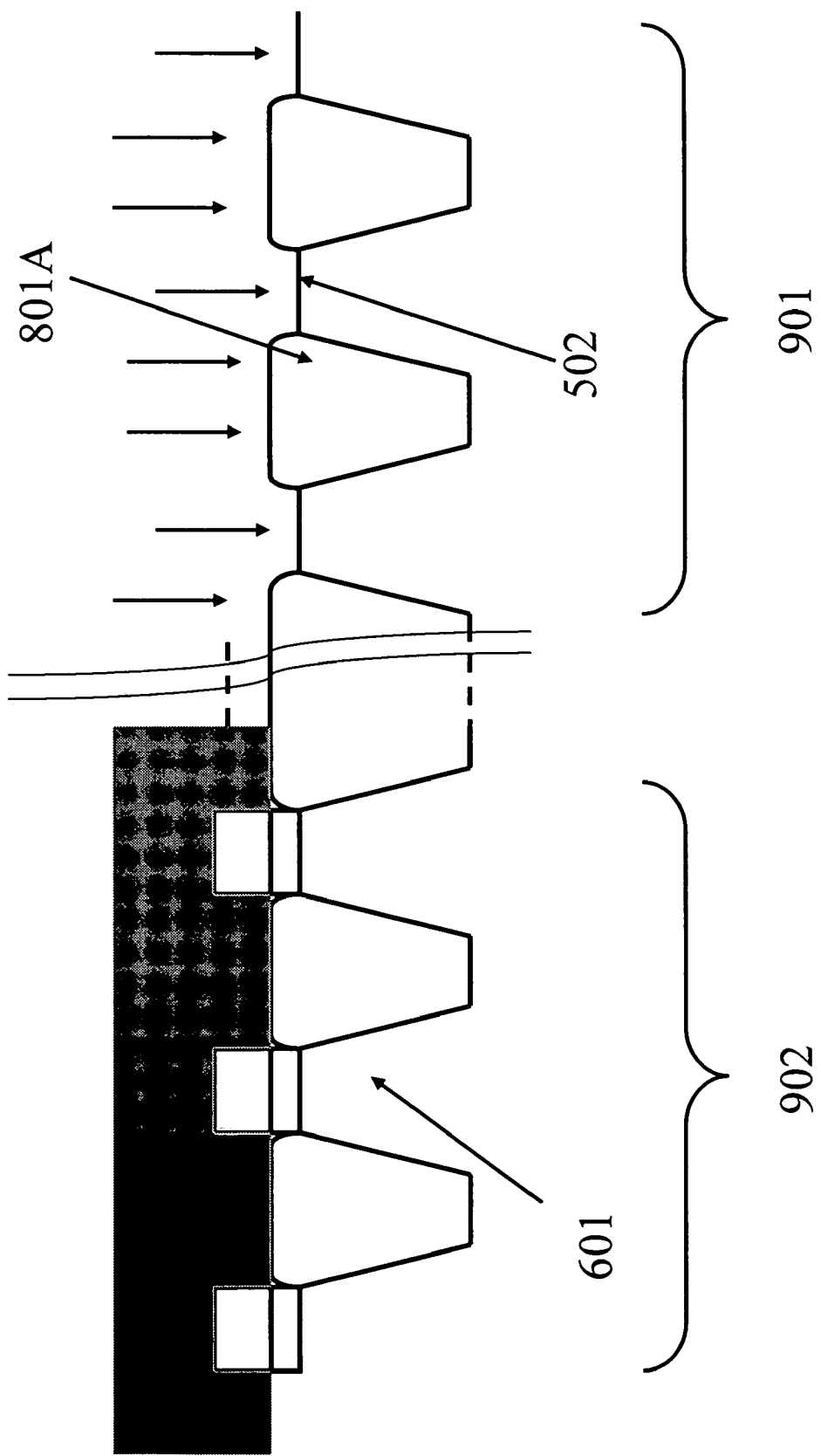
Figure 9D:
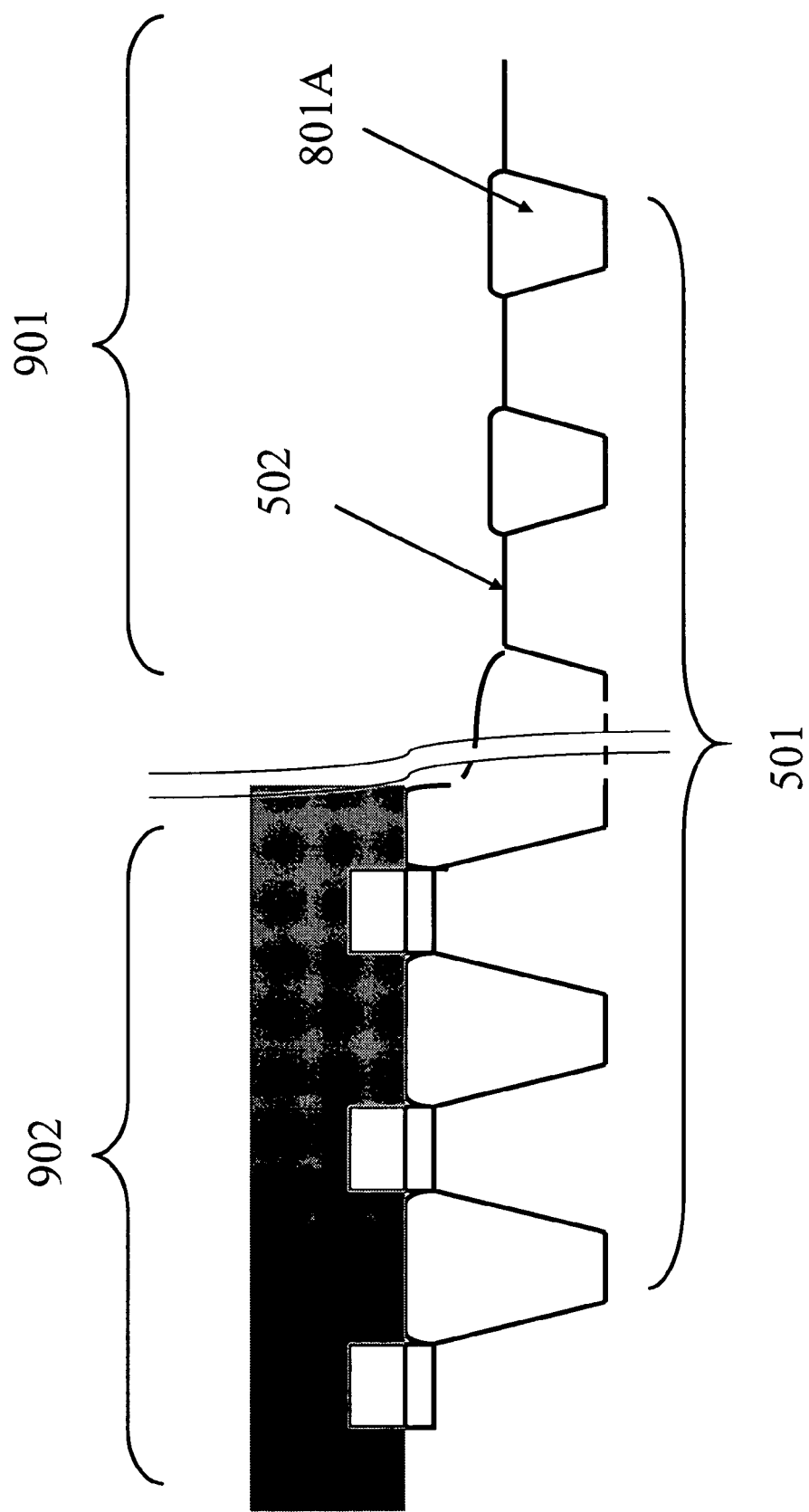

Referring now to FIGS. 9A-9G, the following steps are carried out at this step of the inventive method according to this embodiment, in sequential order:

a matrix area 901 is lithographically defined as shown in FIG. 9A by means of a mask using a resist 903, for example. This lithographic defining step is to protect a circuit area 902 during the next processing steps;

the left-over portion 603B of the nitride layer 603 is removed from the matrix area 901, selectively with respect to the field oxide 801A. This removal may occur for example by chemical attack with phosphoric acid (H3PO4);

left-over portions 602B of the pad oxide layer 602 are removed from the matrix area 901 as shown in FIG. 9C, for example through a BOE (Buffered Oxide Etch) etching or through a solution of diluted hydrofluoric acid (HF);

advantageously in this embodiment of the invention, the exposed portion of the substrate 601 and of the field oxide 801A are etched in the matrix area 901. In this embodiment, this etching realises a digging, which brings down the level of the active areas 502 in the matrix area 901, preferably of equal thickness to that of the floating gate layer to be formed after. In the example, a digging of depth from approximately 50 to 200 nm, preferably from 80 to 130 nm. The formation of the digging is preferably performed in two subsequent steps, comprising a first step whereat the exposed portion of the substrate 601 is selectively etched to the field oxide 801A, and a second etching step whereat the field oxide 801A is etched. This field oxide 801A etching may be realised either through a BOE etching or through a diluted HF solution. Thus, in an advantageous way, differential isolation structures 501 are obtained by applying the method of this embodiment of the invention, these structures in the example here described are of the STI type and they are shown in FIG. 9D.

The above resist 903 is then removed;

a sacrificial dielectric 905 is then grown in the matrix area 901 as shown in FIG. 9E. In the here considered example of flow process, the sacrificial dielectric 905 is silicon oxide and it has the same thickness, ranging from 10 to 20 nm, as the portion 602C of the pad oxide 602 left over in the circuit area 902.

Figure 9F:
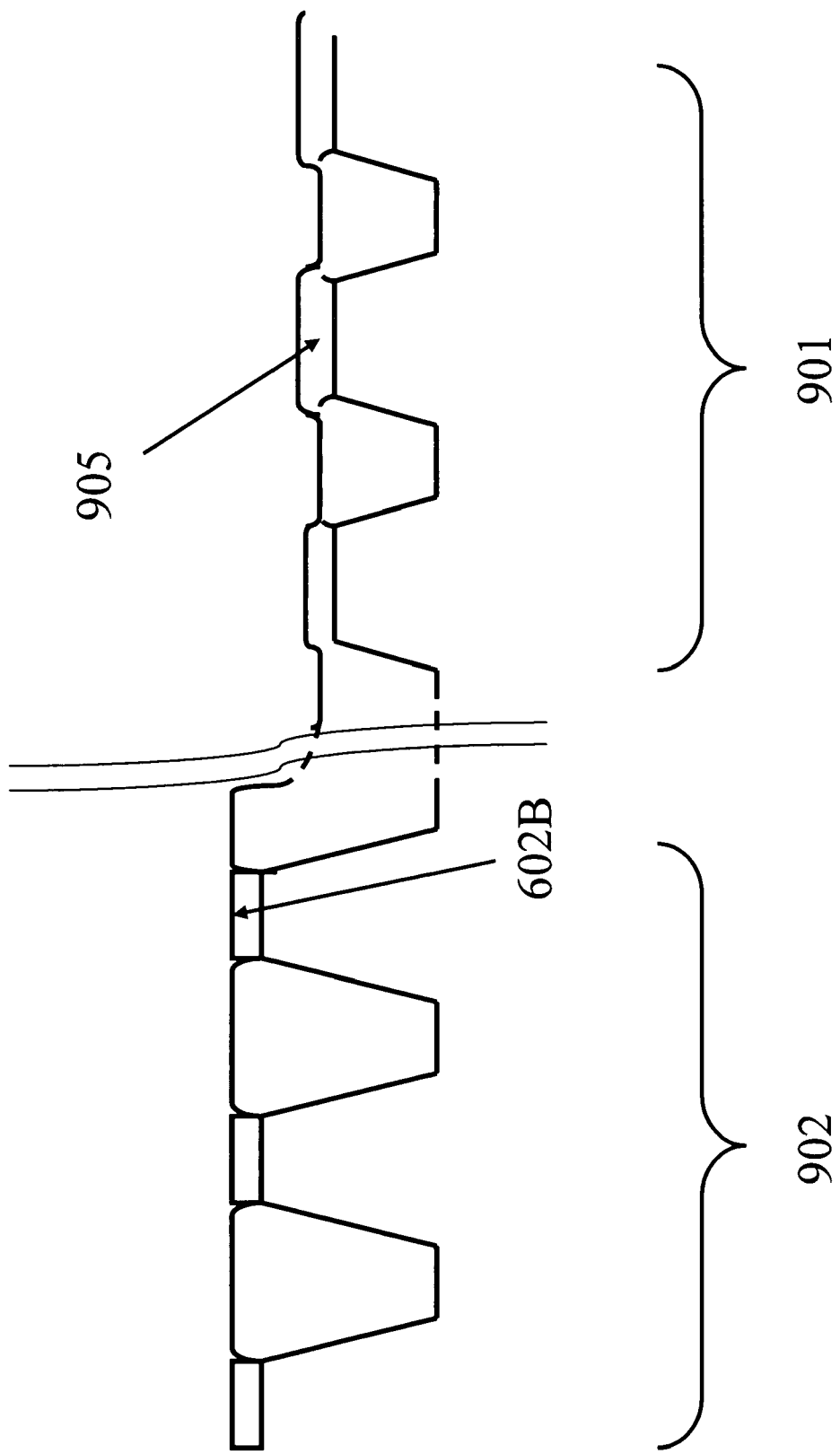

The ion implanting steps needed to form the memory cells of the matrix area 901 are performed through the sacrificial dielectric 905. These ion implanting steps are screened off in the circuit area 902 by the portion 603B yet to be removed of the nitride layer 603;

portion 603B of the nitride layer 603, left over in the circuit area 902, is removed as shown in FIG. 9F;

the sacrificial dielectric 905 is removed from the matrix area 901. Advantageously, in one embodiment of the invention, the left-over portion 602C of pad oxide 602 in the circuit area 902 is removed concurrently therewith, as shown in FIG. 9G.

The here described example of flow process then continues with the customary steps of forming and defining dielectric material layers and electrically active layers on the active areas 502 of the matrix area 901 and 503 of the circuit area 902, shown in FIG. 9G. The active devices, such as the transistors in the circuit area 902 and the memory cells in the matrix area 901, would be completed next using conventional techniques.

The above described process steps of this invention provide, without further alterations of the flow process considered, a near-planar morphology at the level of definition of the gate regions for the device memory cells and transistors, as shown in FIG. 5.

This planar morphology, advantageously provided by this embodiment of an inventive method, makes the lithographic defining of the gate regions in the circuit area 902 and the matrix area 901 easier to carry out in an optimum manner.

The embodiment of an inventive method just described affords two advantages, being independent one another, in a monolithically integrated semiconductor electronic device.

On one side, this embodiment provides differential isolation structures in areas requiring isolation structures of different thickness, without requiring repetition, with respect to a standard single-isolation flow process, of a series of steps such as lithographic defining of active areas, dielectric layers etching, silicon etching, and resist removal. Furthermore, with respect to a standard single-isolation flow process, this embodiment provides differential isolation structures without using an additional mask that is needed in the prior art.

So, in general, the embodiment of the invention can be applied and it is advantageous whenever a monolithically integrated semiconductor electronic device is to be provided with isolation structures of different thickness in different areas, even when no floating gate layers are provided.

The method according to an embodiment of this invention is also effective to remove all current problems during lithographic defining of gate regions of memory cells and transistors, thereby overcoming the disadvantages of the prior art.

These advantages are realised by introducing, in the construction of memory cells and transistors, an adequately different starting level with respect to a semiconductor material substrate. This feature advantageously overcomes the limitations of prior solutions to the aforementioned problems.

In the light of the above considerations, the method according to an embodiment of the invention may be applied and it is advantageous whenever planarity requires to be enhanced in the defining of one or more so-called pre-metal layers, that is layers formed over active areas before the electric contact and interconnection structures are formed. Thus, an aggregate of pre-metal layers is provided by this method with a planar overall morphology, which is obviously advantageous in terms of correct size of the concerned layers, thus leading to an improvement of the device performance.

Furthermore, the structure according to this embodiment of the invention is highly advantageous also in the case of a monolithically integrated semiconductor electronic device, also not comprising floating-gate non-volatile memory cells, wherein areas involving the presence of different-thickness isolation structures and active devices with different heights with respect to a starting substrate are provided. In particular, the advantages of the inventive structure are to be appreciated when isolation structures of smaller thickness and active devices of greater height must be provided in one area with respect to another. In this case, in fact, the embodiment of the invention meets both requirements by a novel single structure.

Various types of integrated circuits can be formed according to embodiments of the present invention, such as memory devices like FLASH memory devices. Such integrated circuits can be used in a variety of different types of electronic systems, such as computer systems, cellular phones, personal digistal assisntants, and so on.

From the foregoing it will be appreciated that, although specific embodiments of the invention have been described herein for purposes of illustration, various modifications may be made without deviating from the spirit and scope of the invention.

The invention claimed is:

1. A method comprising:
defining first and second active areas on a semiconductor substrate;
forming first isolation structure around said first active area and a second isolation structure around said second active area by forming trenches in said active areas and subsequently forming field oxide in said trenches;
removing an upper portion of said second isolation structure for said second active area so that the second isolation structure has a height that is lower than the first isolation structure, such that said first and second isolation structures are not substantially coplanar;
forming a floating gate layer; and
wherein removing an upper portion of said second isolation structure includes also removing an upper portion of said second active area while leaving in place a lower portion of said second active area, said upper portion having a thickness equal to said floating gate layer.

2. A method according to claim 1, wherein said removing includes two successive removal steps.

3. A method according to claim 2, wherein said two successive removal steps comprise selectively etching said substrate towards said field oxide and etching said field oxide.

4. A method according to claim 3, including using a BOE etching during etching of said field oxide.

5. A method according to claim 3, includes providing a diluted HF solution etch of said field oxide.

6. A method according to claim 1, including removing between 50 and 200 nm.

7. A method according to claim 1, including removing between 80 and 130 nm.

8. A method according to claim 1, including forming a sacrificial dielectric within said first device area.

9. A method according to claim 8, including forming said sacrificial dielectric with a thickness comprised between 10 and 20 nm.

10. A method according to claim 8, including forming, on said substrate, a succession of one or more dielectric layers comprising a first silicon oxide layer is provided before realizing said digging, wherein said sacrificial dielectric is silicon oxide and it has the same thickness as that of said first silicon oxide.

11. A method according to claim 10, including removing said sacrificial dielectric and removing a portion of said first silicon oxide layer and simultaneously removing said sacrificial dielectric and a portion of said first silicon oxide layer.

12. A method according to claim 8, including implanting in said first device area and screening off said implanting step in at least a second device area by means of a first nitride layer.

* * * * *